US011572235B2

(12) United States Patent
Otogawa et al.

(10) Patent No.: US 11,572,235 B2
(45) Date of Patent: Feb. 7, 2023

(54) ALIGNER DEVICE AND METHOD FOR CORRECTING POSITIONAL MISALIGNMENT OF WORKPIECE

(71) Applicant: DAIHEN Corporation, Osaka (JP)

(72) Inventors: Yasunobu Otogawa, Osaka (JP); Masato Okuda, Osaka (JP); Yuya Sakaguchi, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 17/201,184

(22) Filed: Mar. 15, 2021

(65) Prior Publication Data

US 2021/0300690 A1 Sep. 30, 2021

(30) Foreign Application Priority Data

Mar. 27, 2020 (JP) .............................. JP2020-057878

(51) Int. Cl.
*H01L 21/68* (2006.01)
*B65G 47/90* (2006.01)
(Continued)

(52) U.S. Cl.
CPC ........ *B65G 47/90* (2013.01); *H01L 21/67259* (2013.01); *H01L 21/681* (2013.01); *H01L 21/67781* (2013.01)

(58) Field of Classification Search
CPC ............... H01L 21/681; H01L 21/6779; H01L 21/67796; H01L 21/67259; H01L 21/67242; H01L 21/67288
See application file for complete search history.

(56) References Cited

U.S. PATENT DOCUMENTS 5,737,441 A * 4/1998 Nishi .................... G06V 10/245
347/3
5,980,195 A * 11/1999 Miyashita ......... H01L 21/67772
414/941
(Continued)

FOREIGN PATENT DOCUMENTS

JP 2013-135099 A 7/2013
JP 2015-195328 A 11/2015

*Primary Examiner* — Ronald P Jarrett
(74) *Attorney, Agent, or Firm* — Hamre, Schumann, Mueller & Larson, P.C.

(57) ABSTRACT

An aligner device includes a robot hand, a lifting mechanism, sensors, a misalignment calculating unit, an x-y misalignment correcting unit, and a θ misalignment correcting unit. The robot hand includes vertically aligned hand members each configured to hold a planar workpiece. The lifting mechanism moves planar workpieces transported by the robot hand up from and down to the hand members, respectively. Each of the sensors, vertically spaced apart from each other, has a downward sensor surface to capture the outline of a planar workpiece brought close to the sensor surface by the workpiece lifting mechanism. The misalignment calculating unit calculates, by using the images of the captured outline shapes of the planar workpieces, an amount of positional misalignment of each planar workpiece with a reference position in X, Y and θ directions. The X-Y misalignment correcting unit corrects the misalignment of each planar workpiece in the X and Y directions based on the amount of X-Y direction misalignment calculated by the misalignment calculating unit. The θ misalignment correcting unit corrects the misalignment of each planar workpiece in the θ direction based on the amount of θ misalignment of the planar workpiece.

4 Claims, 19 Drawing Sheets

(51) Int. Cl.
*H01L 21/67* (2006.01)
*H01L 21/677* (2006.01)

(56) References Cited

U.S. PATENT DOCUMENTS

| | | |
|---|---|---|
| 2015/0016935 A1 | 1/2015 | Hashimoto et al. |
| 2015/0153729 A1 | 6/2015 | Kurahashi et al. |
| 2018/0101165 A1 | 4/2018 | Kurahashi et al. |

* cited by examiner

ALIGNER DEVICE AND METHOD FOR CORRECTING POSITIONAL MISALIGNMENT OF WORKPIECE

FIELD

The present disclosure relates to a technique of correcting positional misalignment of a target object. Specifically, the present disclosure relates to an aligner device and a method for correcting positional misalignment of a workpiece. More specifically, the present disclosure relates to a technique of determining an amount of positional misalignment of a planar workpiece (e.g., a semiconductor wafer) relative to a reference position and correcting the position of the workpiece according to the determined amount of misalignment.

BACKGROUND

In one example, in a semiconductor process, a semiconductor wafer (hereinafter, may be referred to simply as "wafer") is carried into a load lock chamber. The wafer is then transferred by a transfer robot from the load lock chamber to a processing chamber. Depending on the process to be conducted in the processing chamber, the wafer needs to be carried precisely to a reference position in the processing chamber. Conventional solution is to use an aligner device, such as one disclosed in Patent Document 1, before a workpiece is carried into a processing chamber. The aligner device determines an amount of misalignment of a wafer in a planar direction (X-Y direction) and a rotational direction ($\theta$ direction). With information about the determine amount of misalignment, a transfer robot can correct the position of the wafer and transfer the wafer to the reference position in the processing chamber.

In an attempt to reduce the time taken to transfer target objects ("transfer takt time") in a semiconductor process, a transfer robot having multiple hands (a multi-hand transfer robot) as disclosed in Patent Document 2 has been proposed. The transfer robot is capable of transferring a plurality of wafers simultaneously, so that the transfer takt time can be reduced. In order to utilize such a multi-hand transfer robot, the load lock chamber and the processing chamber are designed to hold a plurality of wafers at predetermined intervals in the vertical direction.

However, conventional transfer systems using multi-hand transfer robots still have room for improvement. For example, the conventional transfer system described above is not capable of placing wafers precisely at their reference positions although such precise alignment may be required by a process to be conducted in the processing chamber. In addition, the conventional aligner device disclosed in Patent Document 1 is only capable of determining positional misalignment of a single wager. Therefore, combining the aligner of Patent Document 1 with the multi-hand transfer robot of Patent Document 2 will not render it possible to reduce the transfer takt time.

Patent Document 1: JP-A-2015-195328
Patent Document 2: JP-A-2013-135099

SUMMARY

In view of the circumstances described above, an object of the present disclosure is to provide a solution for determining the amounts of positional misalignment of a plurality of workpieces. Another object of the present disclosure is to provide a solution to correct the positions of the workpieces based on the determined amounts of positional misalignment.

In accordance with a first aspect of the present disclosure, there is provided an aligner device comprising: a robot hand including a plurality of vertically aligned hand members each of which is configured to hold a planar workpiece placed thereon; a workpiece lifting mechanism that moves a plurality of planar workpieces transported by the robot hand up from and down to the plurality of hand members, respectively; a plurality of sensors vertically spaced apart from each other by a predetermined distance, where each of the plurality of sensors has a sensor surface that faces downward to capture an outline shape of a planar workpiece that is brought into proximity to or into contact with the sensor surface by the workpiece lifting mechanism; a positional misalignment calculating unit that calculates, by using an image of an outline shape of a planar workpiece captured by each of the plurality of sensors, an amount of positional misalignment of the planar workpiece with a reference position in X, Y and $\theta$ directions; an X-Y direction positional misalignment correcting unit that corrects positional misalignment of each planar workpiece in the X and Y directions based on an amount of X-Y direction positional misalignment of the planar workpiece calculated by the positional misalignment calculating unit; and a $\theta$ direction positional misalignment correcting unit that corrects positional misalignment of each planar workpiece in the $\theta$ direction based on an amount of $\theta$ direction positional misalignment of the planar workpiece calculated by the positional misalignment calculating unit.

Preferably, the aligner device further comprises a control unit that controls the X-Y direction positional misalignment correcting unit and the $\theta$ direction positional misalignment correcting unit.

In accordance with a second aspect of the present disclosure, there is provided an aligner device comprising: a robot hand including a plurality of vertically aligned hand members each of which is configured to hold a planar workpiece placed thereon; a workpiece lifting mechanism that moves a plurality of planar workpieces transported by the robot hand up from and down to the plurality of hand members, respectively; a plurality of sensors vertically spaced apart from each other by a predetermined distance, where each of the plurality of sensors has a sensor surface that faces downward to capture an outline shape of a planar workpiece that is brought into proximity to or into contact with the sensor surface by the workpiece lifting mechanism; a positional misalignment calculating unit that calculates, by using an image of an outline shape of a planar workpiece captured by each of the plurality of sensors, an amount of positional misalignment of the planar workpiece with a reference position in X, Y and $\theta$ direction; an X-Y direction positional misalignment correcting unit that corrects positional misalignment of each planar workpiece in the X and Y directions based on an amount of X-Y direction positional misalignment of the planar workpiece calculated by the positional misalignment calculating unit; a $\theta$ direction positional misalignment correcting unit that corrects positional misalignment of each planar workpiece in the $\theta$ direction based on an amount of $\theta$ direction positional misalignment of the planar workpiece calculated by the positional misalignment calculating unit; and a control unit that controls the X-Y direction positional misalignment correcting unit and the $\theta$ direction positional misalignment correcting unit. The workpiece lifting mechanism includes at least one pin that supports a planar workpiece from under, the X-Y direction positional misalignment correcting unit corrects positional misalignment of the planar workpiece supported on the pin by moving the pin in the X-Y direction based on the amount of X-Y direction positional misalignment, and the θ direction positional misalignment correcting unit corrects positional misalignment of the planar workpiece supported on the pin by rotating the pin in the θ direction based on the amount of θ direction positional misalignment.

In accordance with a third aspect of the present disclosure, there is provided a method for correcting positional misalignment of a planar workpiece by using an aligner device, where the aligner device includes: a robot hand including a plurality of vertically aligned hand members each of which is configured to hold a planar workpiece placed thereon; a workpiece lifting mechanism that moves each of a plurality of planar workpieces transported by the robot hand up from and down to the plurality of hand members, respectively; a plurality of sensors vertically spaced apart from each other by a predetermined distance, each of the plurality of sensors having a sensor surface that faces downward and being configured to capture an outline shape of a planar workpiece that is brought into proximity to or into contact with the sensor surface by the workpiece lifting mechanism; a positional misalignment calculating unit that calculates, by using an image of an outline shape of a planar workpiece captured by each of the plurality of sensors, an amount of positional misalignment of the planar workpiece with a reference position in X, Y and θ direction; an X-Y direction positional misalignment correcting unit that corrects positional misalignment of each planar workpiece in the X and Y directions based on an amount of X-Y direction positional misalignment of the planar workpiece calculated by the positional misalignment calculating unit, and a θ direction positional misalignment correcting unit that corrects positional misalignment of each planar workpiece in the θ direction based on an amount of θ direction positional misalignment of the planar workpiece calculated by the positional misalignment calculating unit; and a control unit that controls the X-Y direction positional misalignment correcting unit and the θ direction positional misalignment correcting unit, where the workpiece lifting mechanism includes a plurality of pins each of which supports a planar workpiece from under, the X-Y direction positional misalignment correcting unit corrects positional misalignment of the planar workpiece supported on the pin by moving the pin in the X-Y direction based on the amount of X-Y direction positional misalignment, and the θ direction positional misalignment correcting unit corrects positional misalignment of the planar workpiece supported on the pin by rotating the pin in the θ direction based on the amount of θ direction positional misalignment. With the aligner device being thus configured, the method comprises the following steps:

A planar workpiece transferring step, at which the robot hand is moved so that a plurality of planar workpieces on the plurality of hand members are transferred to be positioned at respective alignment reference positions above the plurality of sensors;

A planar workpiece lifting step, at which the plurality of pins are raised to lift the plurality of planar workpieces up from the hand members to bring the planar workpieces into proximity to or into contact with the corresponding sensors;

An outline shape capturing step, at which the outline shape of each of the planar workpieces is captured by the corresponding sensor;

A positional misalignment calculating step, at which an amount of positional misalignment of each of the plurality of planar workpieces with a reference position in the X, Y and θ directions is calculated by using the captured outline shape;

A θ direction position correcting step, at which the plurality of pins of the workpiece lifting mechanism are lowered to move each of the planar workpieces down to a position above the corresponding hand member, and subsequently each of the plurality of pins is rotated based on the calculated amount of positional misalignment in the θ direction;

An X-Y direction position correcting step, at which the plurality of pins of the workpiece lifting are moved based on the calculated positional misalignment in the X, Y and θ directions to align each of the planar workpieces with a reference position on the corresponding hand member; and An after-alignment-placing step, at which the plurality of pins of the workpiece lifting mechanism are lowered to place the aligned planar workpieces onto the corresponding hand members.

With the above arrangements, the aligner device is configured to capture the outline shapes of planar workpieces using the sensors each having a planar sensor surface and calculate the amount of positional misalignment of each planar workpiece with the reference position through the captured image of the outline shape of the planar workpiece. That is, the physical structure of low profile is used for implementing determination of an amount of positional misalignment of a planar workpiece.

The aligner device can therefore be configured to be able to simultaneously detect positional misalignment of a plurality of planar workpieces transferred by a multi-stage robot hand and simultaneously correct the positions of the plurality of planar workpieces. Consequently, the aligner device can significantly reduce the transfer takt time of a plurality of semiconductor wafers, including the time for correcting positional misalignment in a semiconductor process, for example.

Other features and advantages of the present disclosure will be more apparent from the detailed description given below with reference to the accompanying drawings.

EMBODIMENTS

The following describes preferred embodiments of the present disclosure, with reference to the drawings.

FIGS. 1 to 4 show an aligner device A1 according to an embodiment of the present disclosure.

Figure 1:
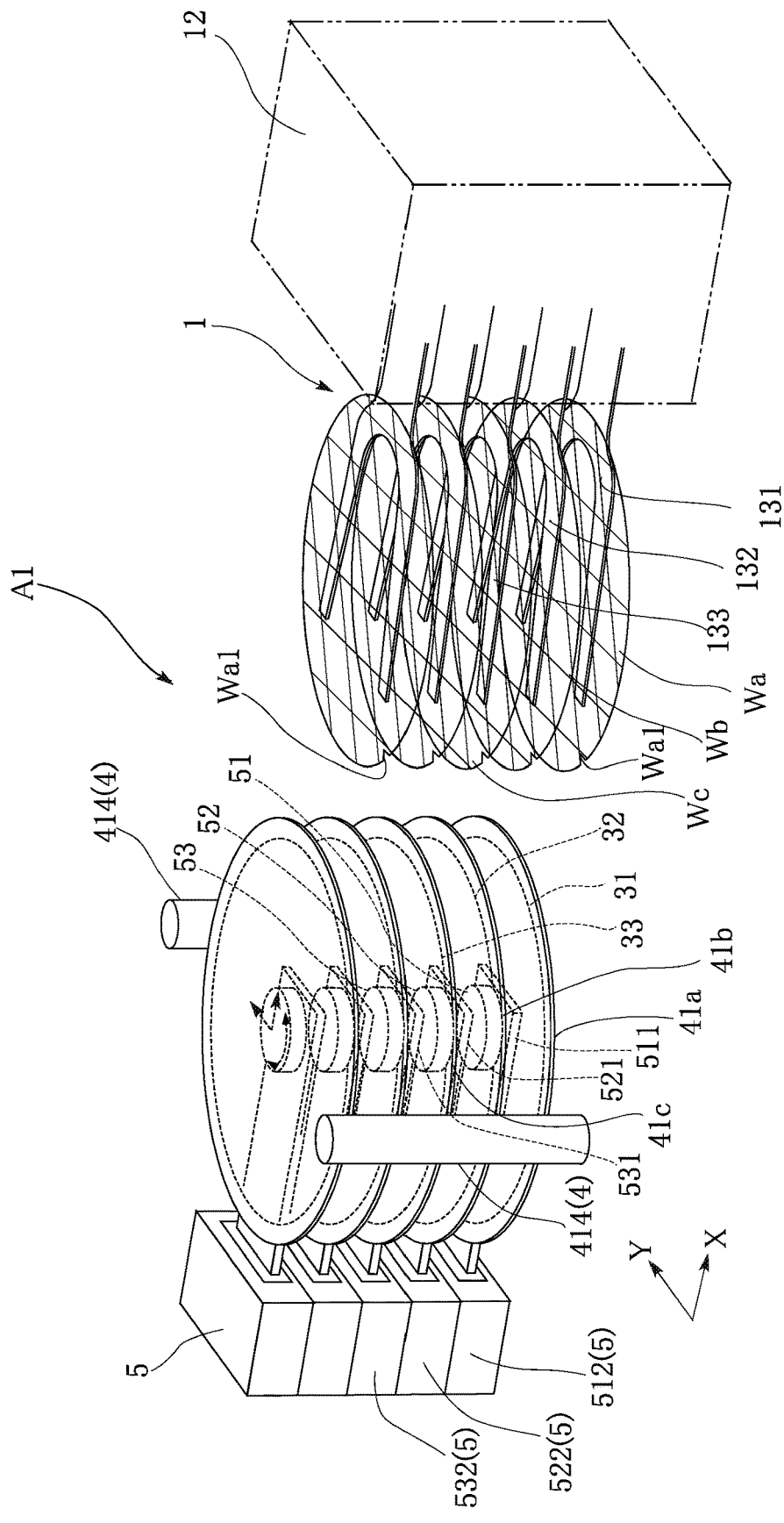
FIG. 1 is an overall perspective view of an aligner device according to the present disclosure.
Figure 2:
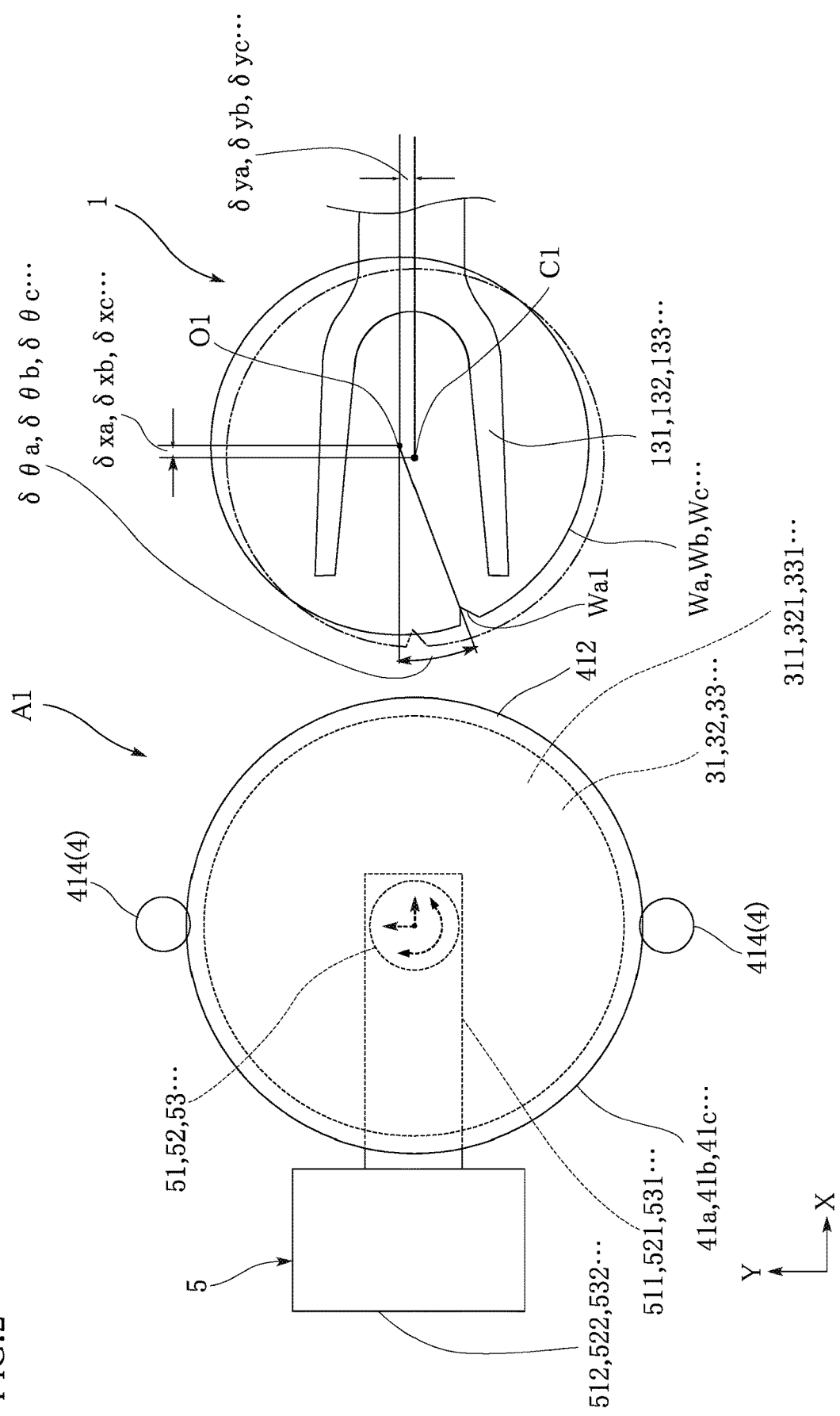
FIG. 2 is a schematic plan view of the aligner device shown in FIG. 1.
Figure 3:
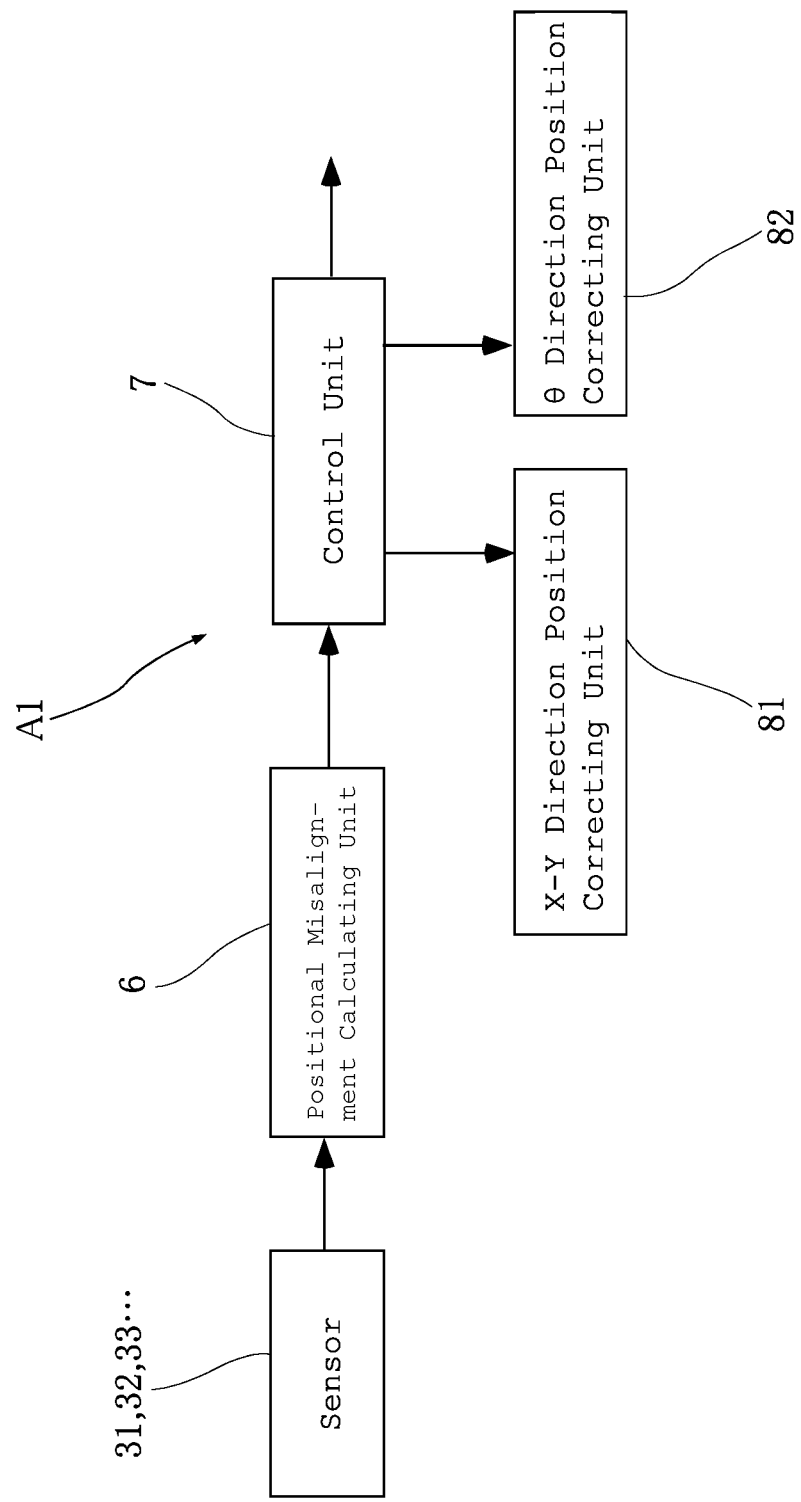
FIG. 3 is a block diagram showing the configuration of the aligner device according to the present disclosure.

As shown in FIGS. 1 to 3, the aligner device A1 cooperates with a robot hand 1. The aligner device A1 includes a plurality of sensors spaced apart from each other in the vertical direction. In the example shown in the figures, the aligner device A1 includes five sensors 31, 32, 33 . . . , which however is not a limitation of the present disclosure. In the example shown in the figures, the sensors 31, 32, 33 . . . are vertically spaced apart at regular intervals, which however is not a limitation of the present disclosure either. In addition to the plurality of sensors, the aligner device A1 includes a workpiece lifting mechanism 5, a positional misalignment calculating unit 6, a first positional misalignment correcting unit 81, a second positional misalignment correcting unit 82 and a control unit 7. The positional misalignment calculating unit 6 calculates the amounts of positional misalignment of the workpieces Wa, Wb, Wc . . . with the reference positions, based on information received from the sensors 31, 32, 33 . . . regarding the shapes of the workpieces Wa, Wb, Wc . . . . In the example shown in the figures, each sensor 31, 32, 33 . . . sends information regarding the shape of the outline of a corresponding workpiece (workpiece outline shape information) to the positional misalignment calculating unit 6. This, however, is not a limitation of the present disclosure. In the example shown in the figures, the first positional misalignment correcting unit 81 is an X-Y direction position correcting unit for correcting the position of a workpiece in the X-Y direction, and the second positional misalignment correcting unit 82 is a θ direction position correcting unit for correcting the position of a workpiece in the θ direction. This, however, is not a limitation of the present disclosure.

The robot hand 1 includes a support 12 and a plurality of hand members 131, 132, 133 . . . . The support 12 is provided at an end arm (not shown) of an articulated robot, for example. The hand members 131, 132, 133 . . . are configured to hold workpieces (e.g., semiconductor wafers) Wa, Wb, Wc . . . on their upper surfaces. The vertical intervals between the adjacent hand members 131, 132, 133 . . . may or may not be adjustable. The robot hand 1 controls a manipulator (not shown) to at least achieve the function of moving each of the hand members 131, 132, 133 . . . in the horizontal direction (X-Y direction) while keeping the hand members horizontal. As shown in FIGS. 1 and 2, the hand members 131, 132, 133 . . . have the shape of a two-pronged fork. Preferably, the hand members 131, 132, 133 . . . are configured to apply suction via vacuum to secure the semiconductor wafers Wa, Wb, Wc . . . onto their upper surfaces.

The hand members 131, 132, 133 . . . are not limited to a specific shape and may have the shape of a three-pronged fork or another shape.

Figure 4:
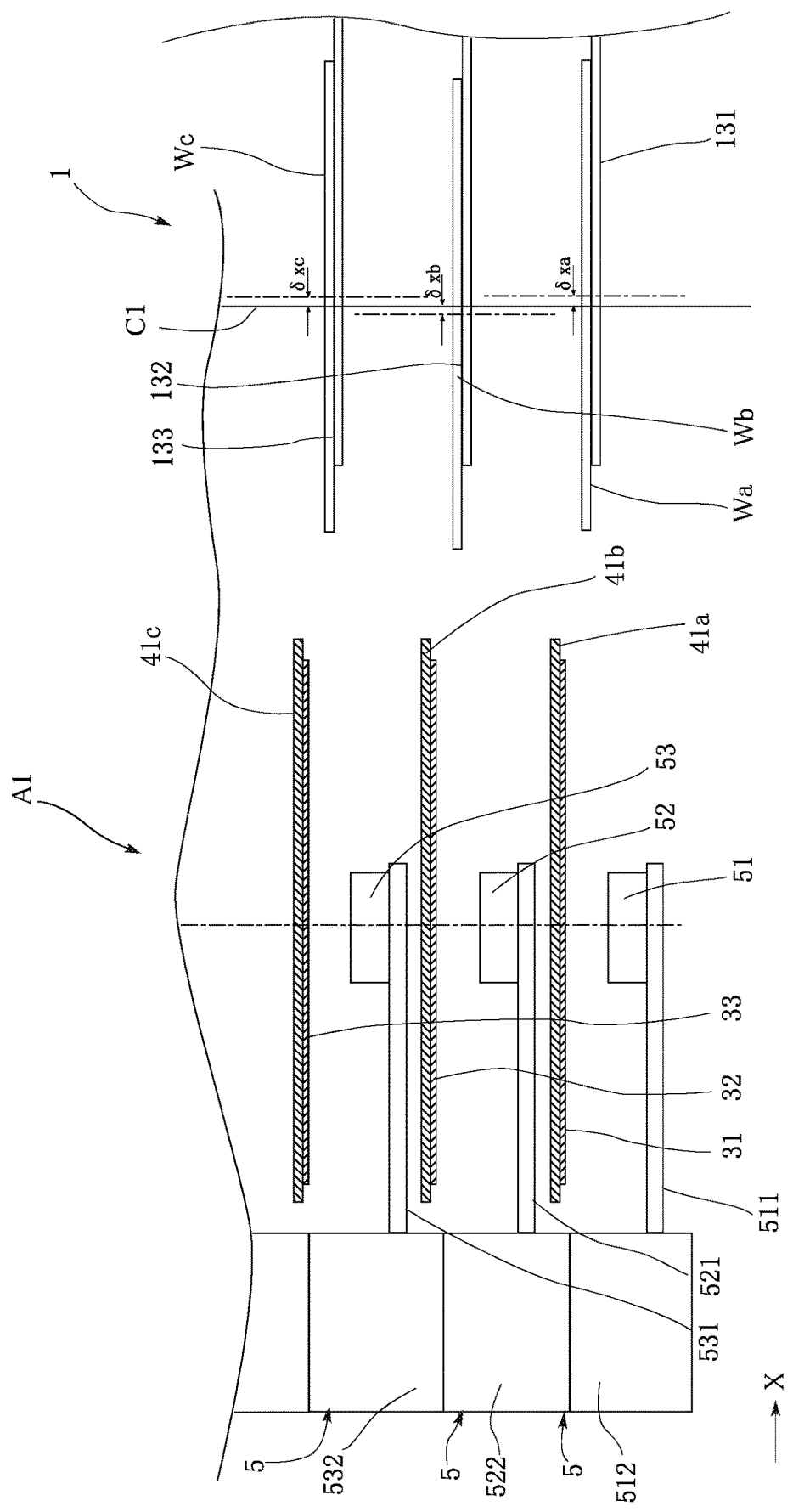
FIG. 4 is a view showing an operation state of the aligner device shown in FIG. 1.

The sensors 31, 32, 33 . . . are contact or non-contact proximal sensors having the function of capturing an image of the outline of a target object. In the example shown in the figures, each of the sensors 31, 32, 33 . . . is configured to sense the planner (two-dimensional) outline of a target object located underneath the sensor. As shown in FIG. 4, the sensors 31, 32, 33 . . . are attached to the undersurfaces of sensor tables 41a, 41b, 41c . . . with their sensor surfaces 311, 321, 331 . . . facing downward. The sensor tables 41a, 41b, 41c . . . are supported on a frame 4 (e.g., columns 414) (see FIGS. 1 and 2). Example of the sensors 31, 32, 33 . . . include those electrostatically sensing the presence of a target object as used in touch-sensitive panels or those composed of two-dimensional arrays of image pickup elements such as CCDs.

In the example shown in the figures, the sensors 31, 32, 33 . . . capture the outline shapes of the semiconductor wafers Wa, Wb, Wc . . . . The planar shape of each sensor 31, 32, 33 . . . is not specifically limited as long as it allows for a margin of positioning error of the semiconductor wafer Wa, Wb, Wc . . . in the X-Y direction to reliably to capture the outline shape of the semiconductor wafer. For examples, the sensors 31, 32, 33 . . . may be have a circular shape as in FIG. 2 or a polygonal (e.g., rectangular) or ring shape.

Figure 5:
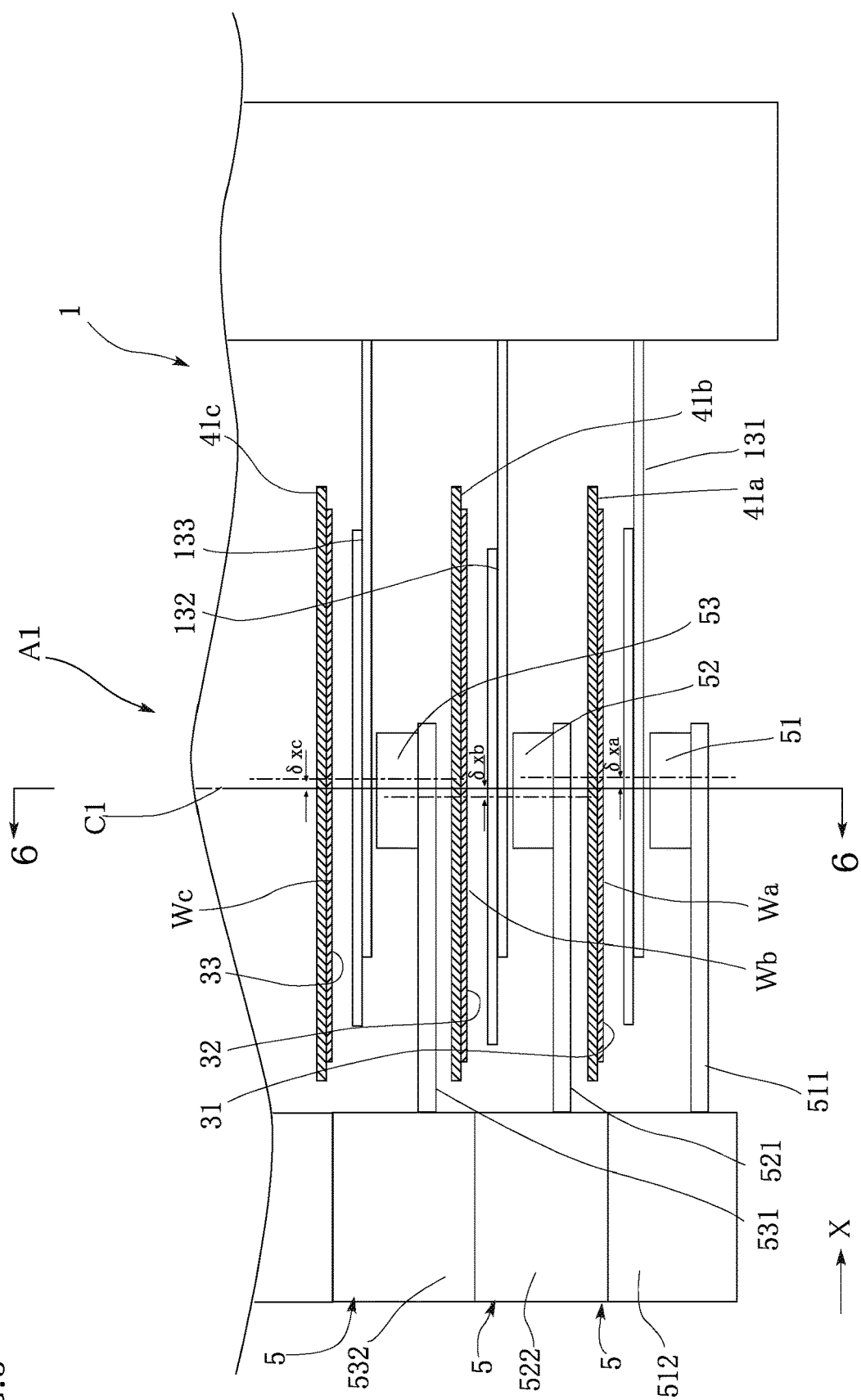
FIG. 5 is a view showing an operation state of the aligner device shown in FIG. 1.

As shown most clearly in FIG. 5, the workpiece lifting mechanism 5 includes a plurality of workpiece supporting members 51, 52, 53 . . . . In one example, the workpiece supporting members each have the shape of a circular cylinder or a pin. The workpiece supporting members of the present disclosure, however, are not limited to this example and may have a different shape as long as the functions described below are provided. For convenience, the following description refers to each workpiece supporting member as a "pin". The workpiece lifting mechanism 5 has the function of supporting the semiconductor wafers Wa, Wb, Wc . . . from under by the pins 51, 52, 53 . . . . In addition, the workpiece lifting mechanism 5 has the function of raising and lowering the pins 51, 52, 53 . . . to lift the semiconductor wafers Wa, Wb, Wc . . . up and down, the function of moving the pins 51, 52, 53 . . . in the X-Y direction, and the function of rotating the pins 51, 52, 53 . . . about the vertical axis. To achieve these functions, the workpiece lifting mechanism 5 includes a plurality of arms 511, 521, 531 . . . and a plurality of support bases 512, 522, 532 . . . . The pins 51, 52, 53 . . . described above are respectively attached to the distal ends of the arms 511, 521, 531 . . . . The base ends of the arms 511, 521, 531 . . . are coupled in the support bases 512, 522, 532 . . . to a lifting mechanism (not shown). The lifting mechanism is coupled to X-direction and Y-direction actuators (not shown). In addition, the workpiece lifting mechanism 5 is configured to rotate the pins 51, 52, 53 . . . by, for example, transmitting rotation of motors (not shown) provided at the base ends of the arms 511, 521, 531 . . . in the support bases 512, 522, 532 . . . via belt-and-pully transmission mechanisms (not shown) integrated in the arms 511, 521, 531 . . . . Normally, the pins 51, 52, 53 . . . are located at the center of the sensor tables 41a, 41b, 41c . . . in plan view, and the arms 511, 521, 531 . . . extend outward below the sensor tables 41a, 41b, 41c . . . to the support bases 512, 522, 532 . . . . The pins 51, 52, 53 . . . each have a circular upper surface that is large enough to stably hold the corresponding semiconductor wafer Wa, Wb, Wc . . . placed thereon. Preferably, the pins 51, 52, 53 . . . are configured to grip the semiconductor wafers Wa, Wb, Wc . . . by suction. The suction may be applied by, for example, a vacuum (or relatively low pressure) created by a vacuum pump. However, this is not a limitation of the present disclosure. In the example shown in the figures, the function of moving the pins 51, 52, 53 . . . in the X-Y direction corresponds to the first direction (X-Y direction) positional misalignment correcting unit 81 (FIG. 4). In addition, the function of rotating the pins 51, 52, 53 . . . about the vertical axis corresponds to the second direction (θ direction) positional misalignment correcting unit 82 (FIG. 4).

Typically, each of the semiconductor wafers Wa, Wb, Wc . . . has the shape of a circular disc as shown in FIGS. 1 and 2. The circumferential edge of each wafer has a feature used to identify the rotational orientation of the wafer. The feature may be formed by cutting away a portion of the edge, and a notch Wa1 is provided in the example shown in the figure. In another example, an orientation flat (not shown) may be provided instead of a notch to indicate the orientation of the wafer. During the semiconductor process, the semiconductor wafers Wa, Wb, Wc . . . are conveyed into the processing chamber and subjected to predetermined processing. Some processing requires each semiconductor wafer Wa, Wb, Wc . . . to be positioned precisely at the reference positions in the X-Y direction and the θ direction. In the present embodiment, the multi-stage robot hand 1 adjusts the positions of the semiconductor wafers Wa, Wb, Wc . . . to correct positional misalignment before the semiconductor wafers Wa, Wb, Wc . . . are simultaneously carried into the processing chamber.

Figure 10:
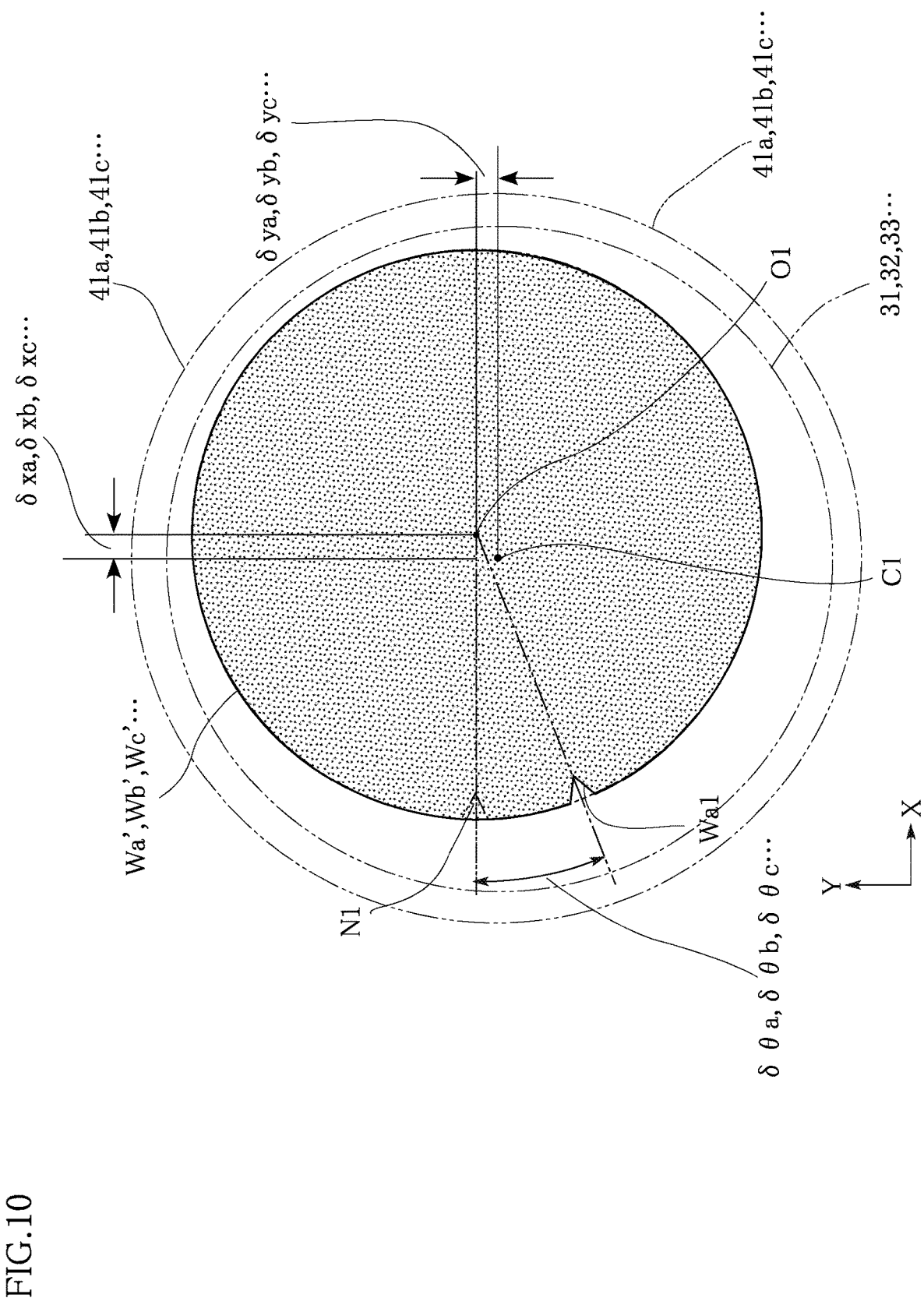
FIG. 10 is a schematic plan view showing an operation state of the aligner device shown in FIG. 1.

The positional misalignment calculating unit 6 determines the amounts of positional misalignment of the semiconductor wafers Wa, Wb, Wc . . . in the X-Y direction and the θ direction relative to the respective reference positions, based on the shapes of the images of the semiconductor wafers Wa, Wb, Wc . . . captured by the sensors 31, 32, 33 . . . . Specifically, the center of the captured image of each semiconductor wafer is determined as shown in FIG. 10. Suppose, for example, that O1 denotes the center of the circle defined by the outer edge of the image of the semiconductor wafer Wa', Wb', Wc' . . . and that C1 denotes the reference position at which the center of the semiconductor wafer Wa, Wb, Wc . . . to be placed. Then, the positional misalignment calculating unit 6 calculates the amount of X direction misalignment δxa, δxb, δxc . . . and the amount of Y direction misalignment δya, δyb, δyc . . . , based on the center O1 and the reference position C1 (the relative position of the center O1 to the reference position C1). The positional misalignment calculating unit 6 also calculates the amount of θ direction misalignment δθa, δθb, δθc . . . based on the position (or orientation, for example) of the notch Wa1 in the image Wa', Wb', Wc' . . . and the reference position N1 at which the notch Wa1 of the semiconductor wafer Wa, Wb, Wc . . . is to be placed.

The aligner device A1 having the configuration described above may operate in the following manner.

Figure 6:
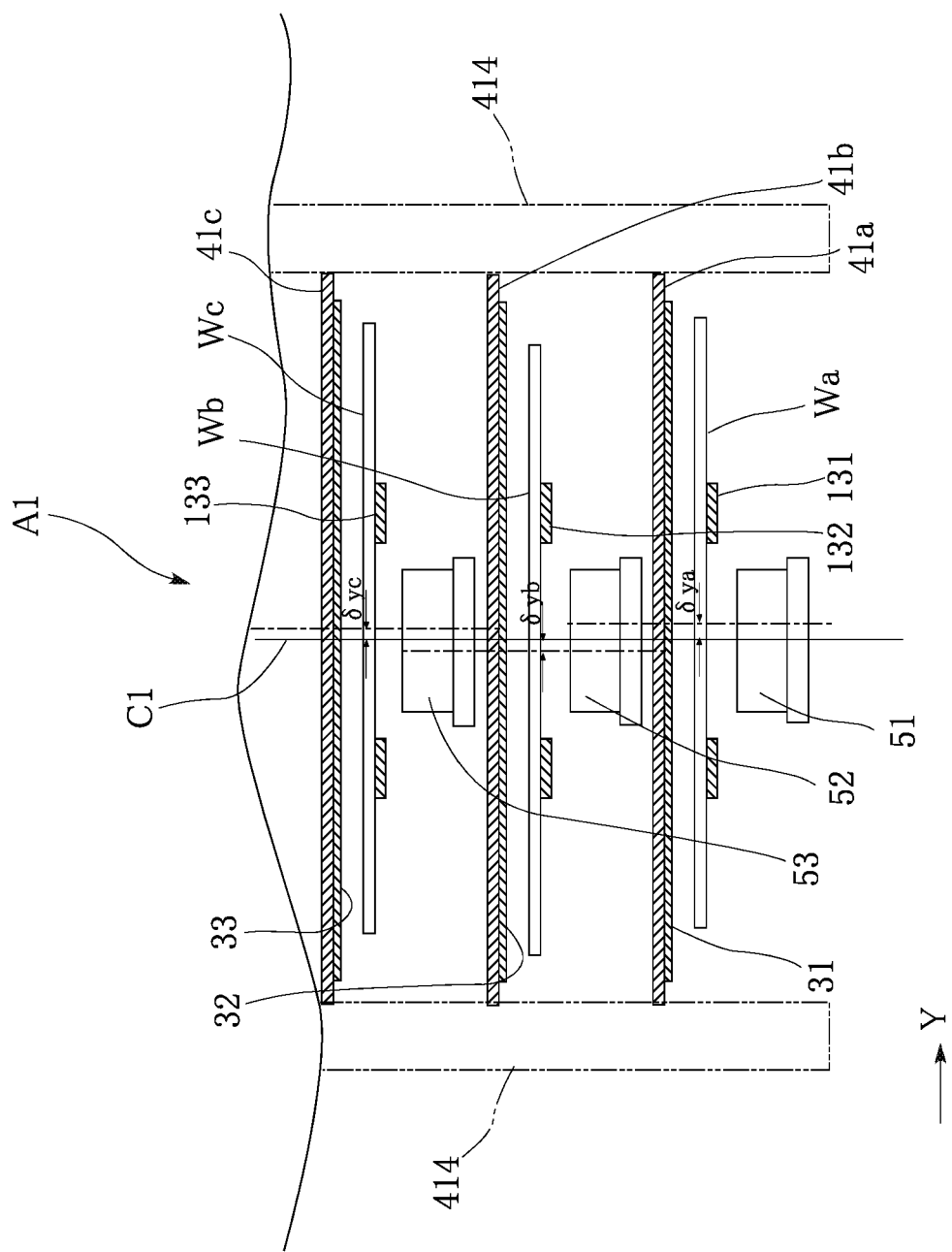
FIG. 6 is a sectional view taken along line 6-6 of FIG. 5.

As shown in FIG. 4, the pins 51, 52, 53 . . . are at the predetermined lowermost positions relative to the respective sensor tables 41*a*, 41*b*, 41*c* . . . and have the centers of rotation coincide with each other in plan view. The robot hand 1 holding the semiconductor wafers Wa, Wb, Wc . . . on the hand members 131, 132, 133 . . . move in the X direction. As shown in FIGS. 5 and 6, the hand members 131, 132, 133 . . . are moved until they reach the respective alignment reference positions to place the semiconductor wafers Wa, Wb, Wc . . . underneath the sensors 31, 32, 33 . . . . The semiconductor wafers Wa, Wb, Wc . . . held on the hand members 131, 132, 133 . . . have been fed simultaneously from a multi-cassette feeder (not shown) or from a load lock chamber (not shown). Thus, the semiconductor wafers Wa, Wb, Wc . . . on the hand members 131, 132, 133 . . . are often deviated from proper alignment in the X-Y direction and/or in the θ direction. In the states shown in FIGS. 5 and 6, the rotation center of each pin 51, 52, 53 . . . is set as the reference position C1 for positioning the semiconductor wafer Wa, Wb, Wc . . . relative to the hand member 131, 132, 133 . . . .

Figure 7:
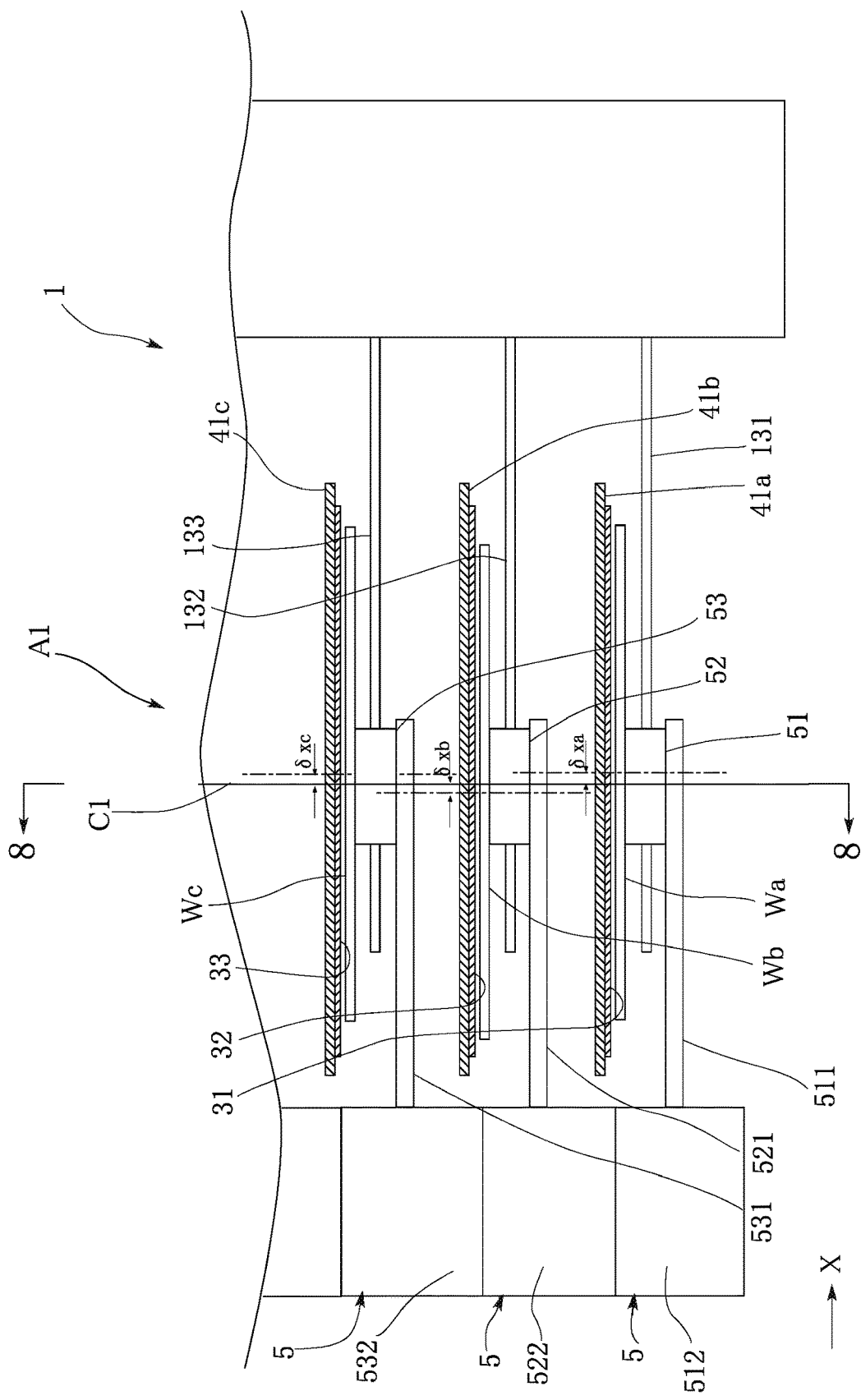
FIG. 7 is a view showing an operation state of the aligner device shown in FIG. 1.
Figure 8:
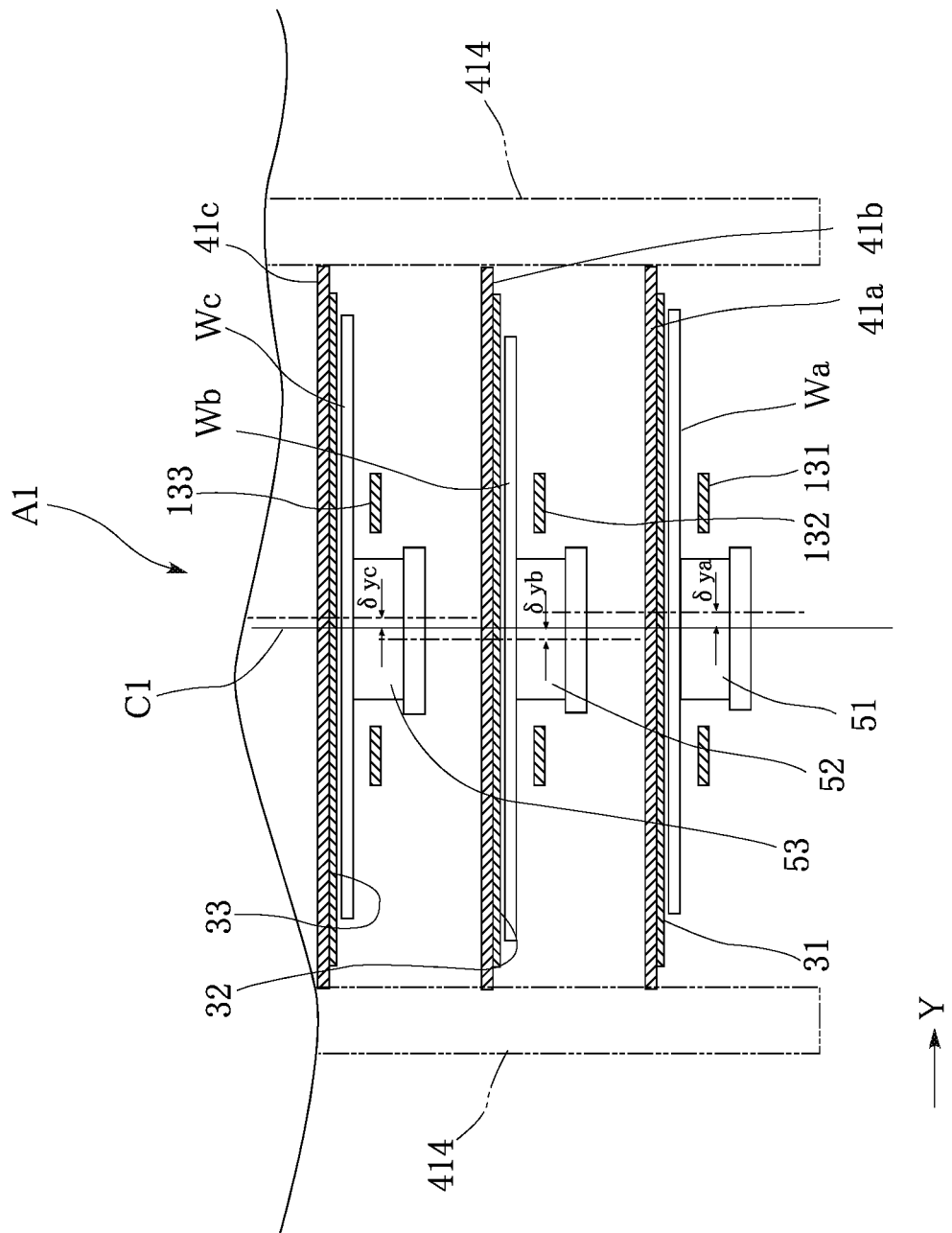
FIG. 8 is a sectional view taken along line 8-8 of FIG. 7.
Figure 9:
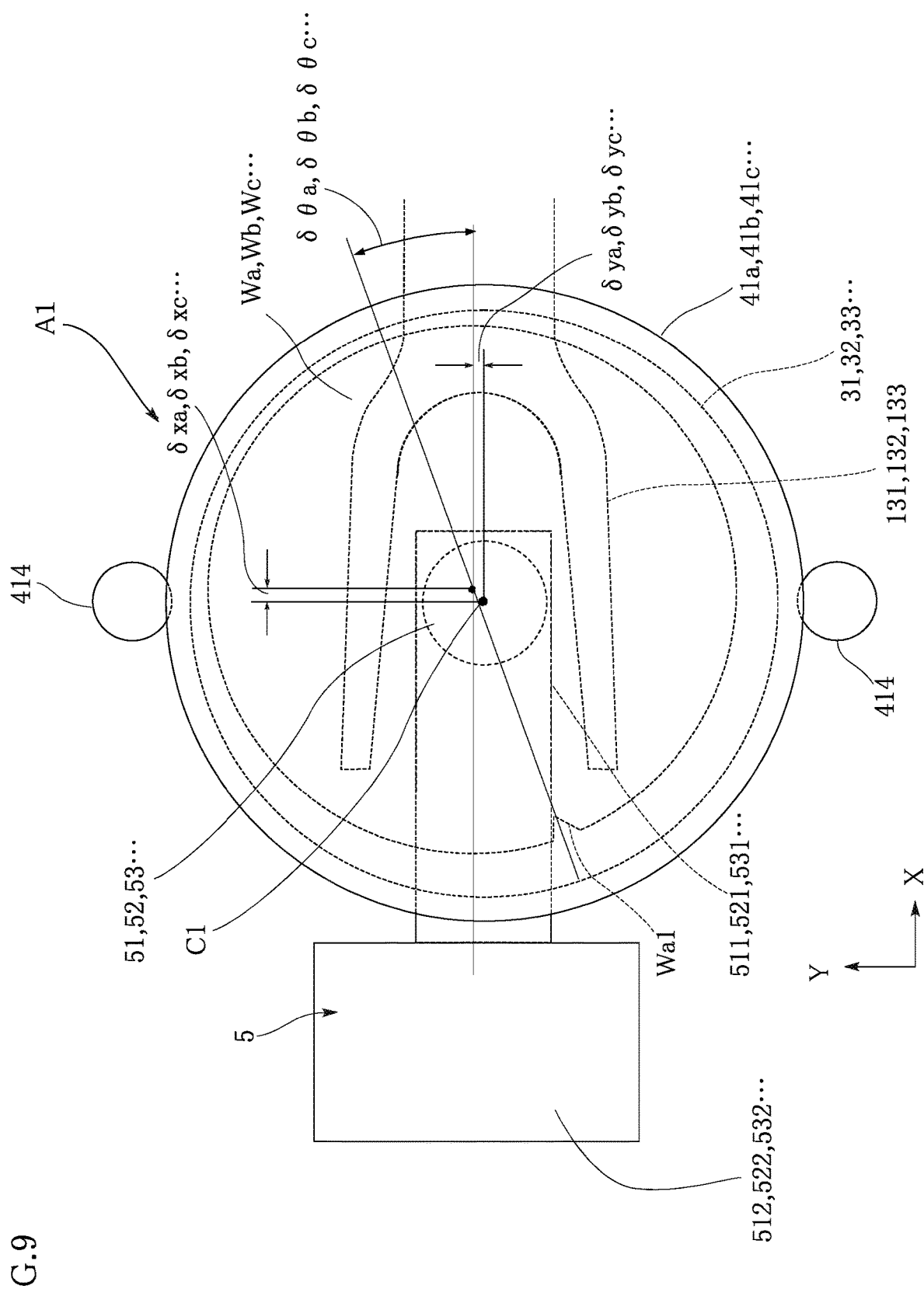
FIG. 9 is a schematic plan view showing an operation state of the aligner device shown in FIG. 1.

Next, as shown in FIGS. 7 and 8, the pins 51, 52, 53 . . . are raised to lift the semiconductor wafers Wa, Wb, Wc . . . up from the hand members 131, 132, 133 . . . until the semiconductor wafers Wa, Wb, Wc . . . are placed near the undersurfaces the sensors 31, 32, 33 . . . . Note that the semiconductor wafers Wa, Wb, Wc . . . need to be kept out of contact with the sensors 31, 32, 33 . . . to avoid possible contamination of the wafer surfaces. When the semiconductor wafers Wa, Wb, Wc . . . are lifted up from the hand members 131, 132, 133 . . . by the pins 51, 52, 53 . . . , the hand members 131, 132, 133 release the suction on the semiconductor wafers Wa, Wb, Wc . . . , and the pins 51, 52, 53 . . . exert suction on the semiconductor wafers Wa, Wb, Wc . . . . In this state, the sensors 31, 32, 33 . . . acquire image data representing the outline shapes of the semiconductor wafers Wa, Wb, Wc . . . as described above. The positional misalignment calculating unit 6 receives the image data and calculates the amounts of positional misalignment of each semiconductor wafer Wa, Wb, Wc . . . relative to the reference position C1 and also to the reference position N1. More specifically, the amounts of X direction misalignment δxa, δxb, δxc . . . , the amounts of Y direction misalignment δya, δyb, δyc . . . , and the amounts of θ direction misalignment δθa, δθb, δθc . . . are calculated for the respective semiconductor wafers Wa, Wb, Wc . . . (FIGS. 9 and 10).

Figure 11:
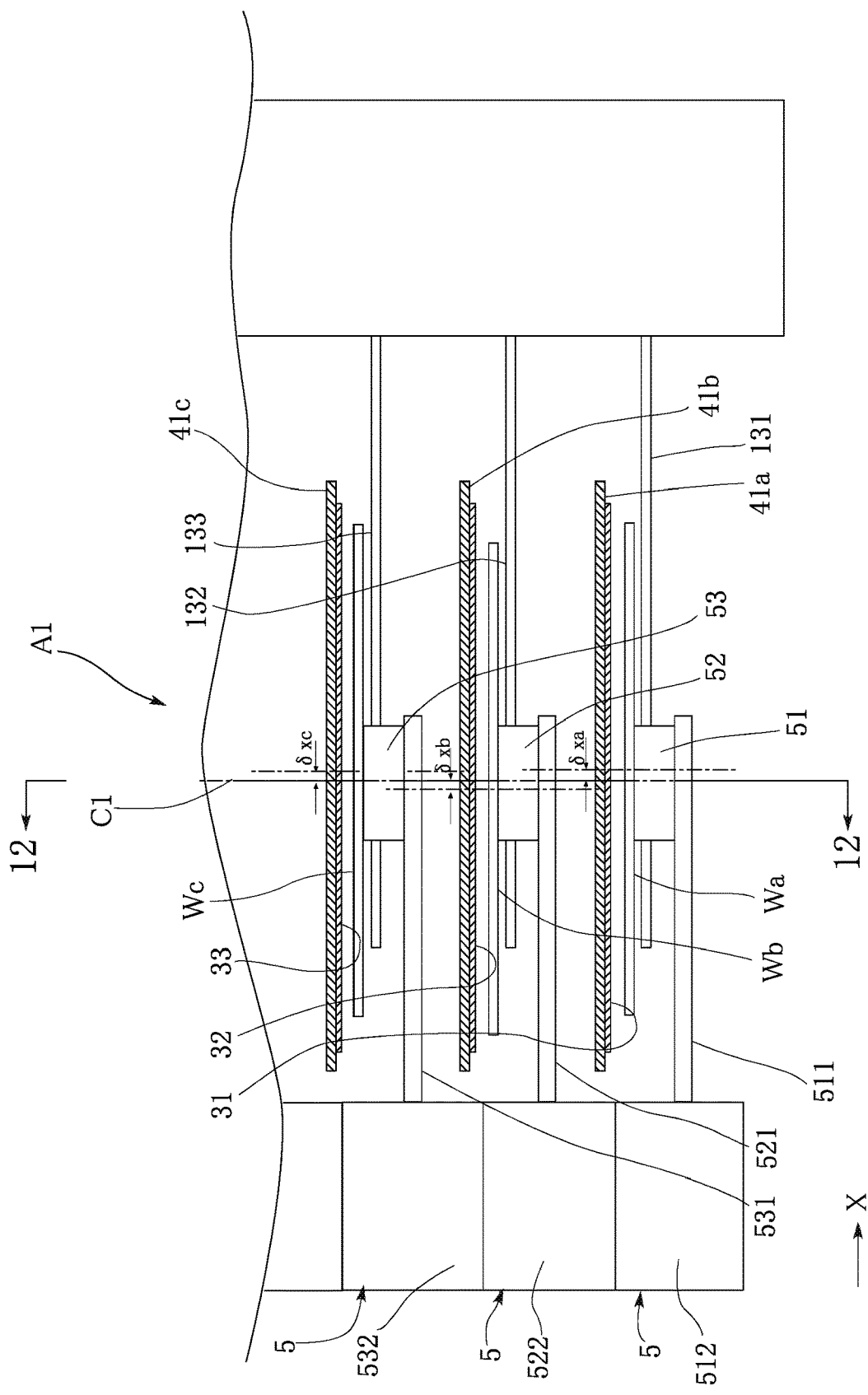
FIG. 11 is a view showing an operation state of the aligner device shown in FIG. 1.
Figure 12:
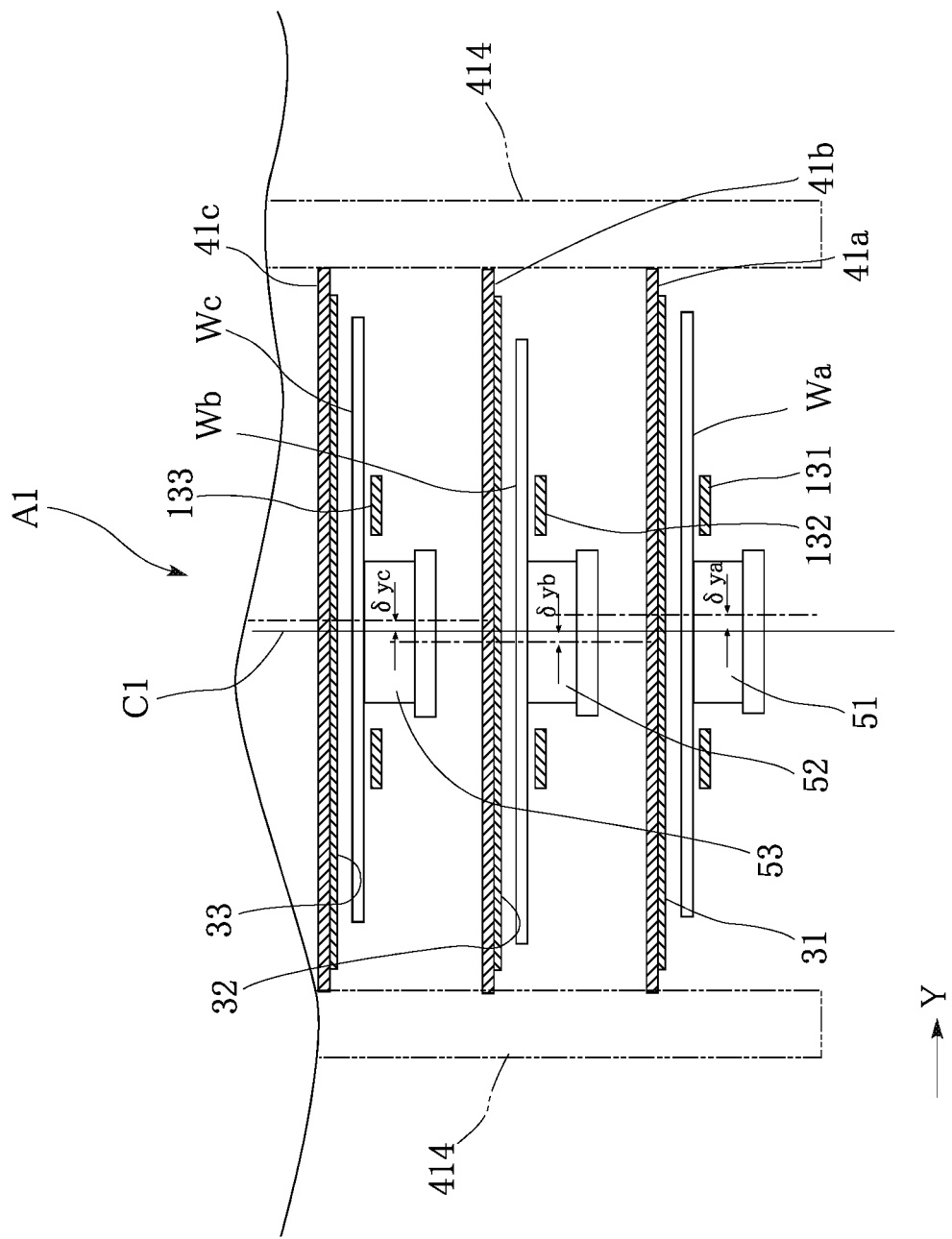
FIG. 12 is a sectional view taken along line 12-12 of FIG. 11.
Figure 13:
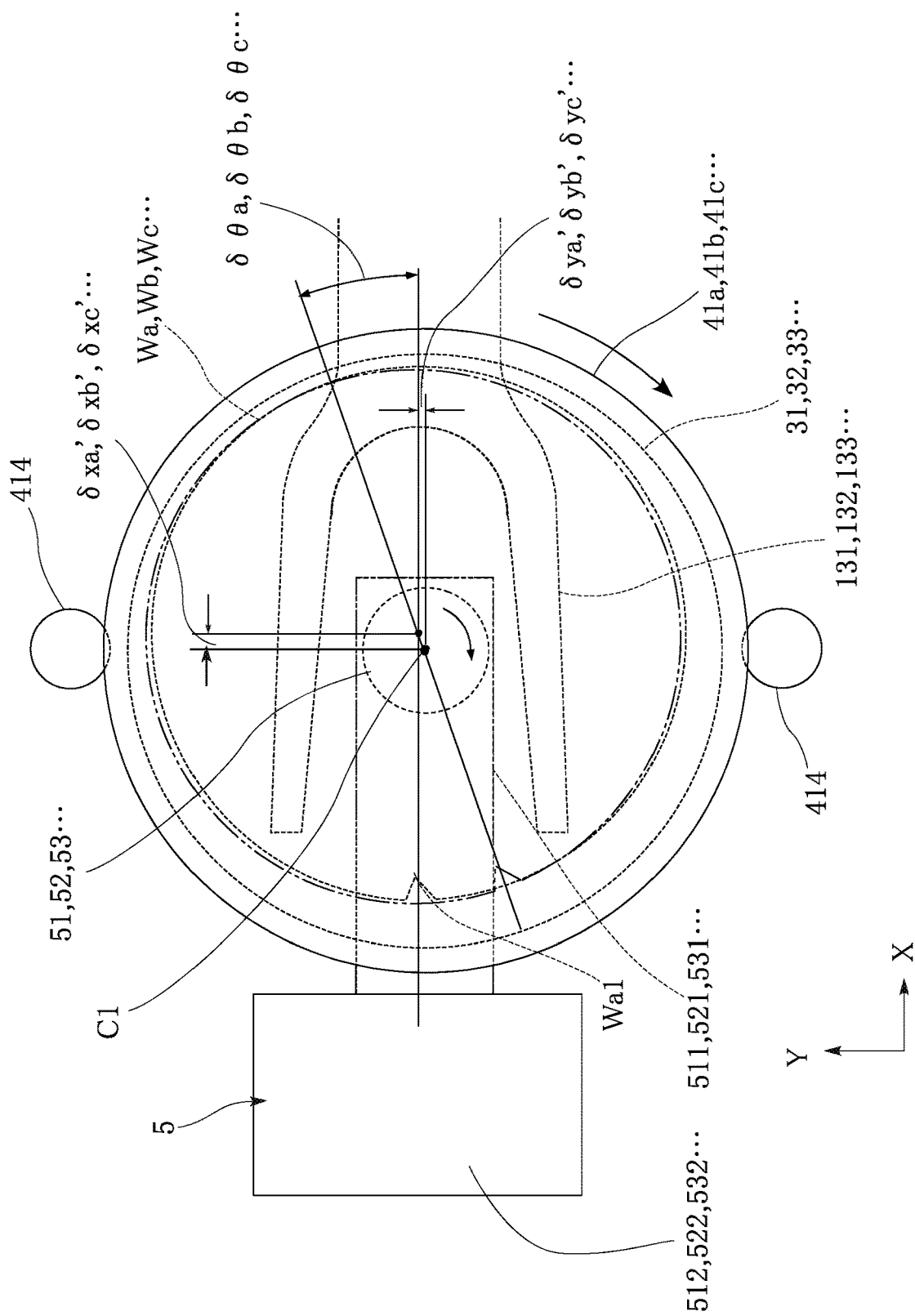
FIG. 13 is a schematic plan view showing an operation state of the aligner device shown in FIG. 1.

Subsequently, as shown in FIGS. 11 and 12, the pins 51, 52, 53 . . . still holding the semiconductor wafers Wa, Wb, Wc . . . are lowered by a predetermined distance. In this state, the semiconductor wafers Wa, Wb, Wc . . . are spaced above the hand members 131, 132, 133 . . . . Subsequently, as shown in FIG. 13, the pins 51, 52, 53 . . . are rotated according to the amounts of θ direction misalignment δθa, δθb, δθc . . . (for example, each pin is rotated in the direction and amount corresponding to δθa, δθb, δθc . . . ). As a result, each notch Wa1 is brought to a position on a line extending in the X direction to pass the center O1 of the semiconductor wafer Wa, Wb, Wc . . . . In this way, the positions of the semiconductor wafers Wa, Wb, Wc . . . are corrected by the amounts of θ direction misalignment δθa, δθb, δθc . . . .

Figure 14:
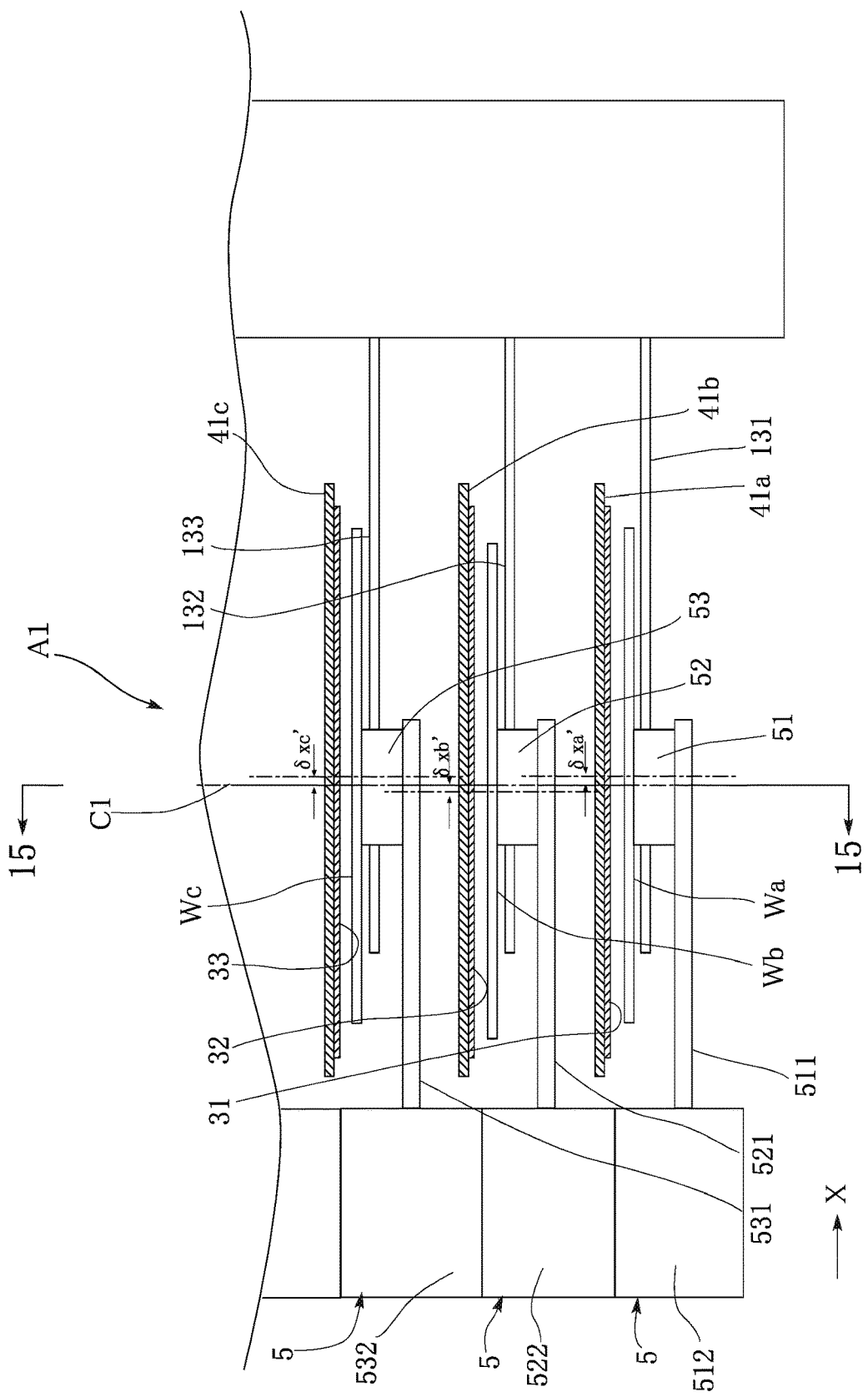
FIG. 14 is a view showing an operation state of the aligner device shown in FIG. 1.
Figure 15:
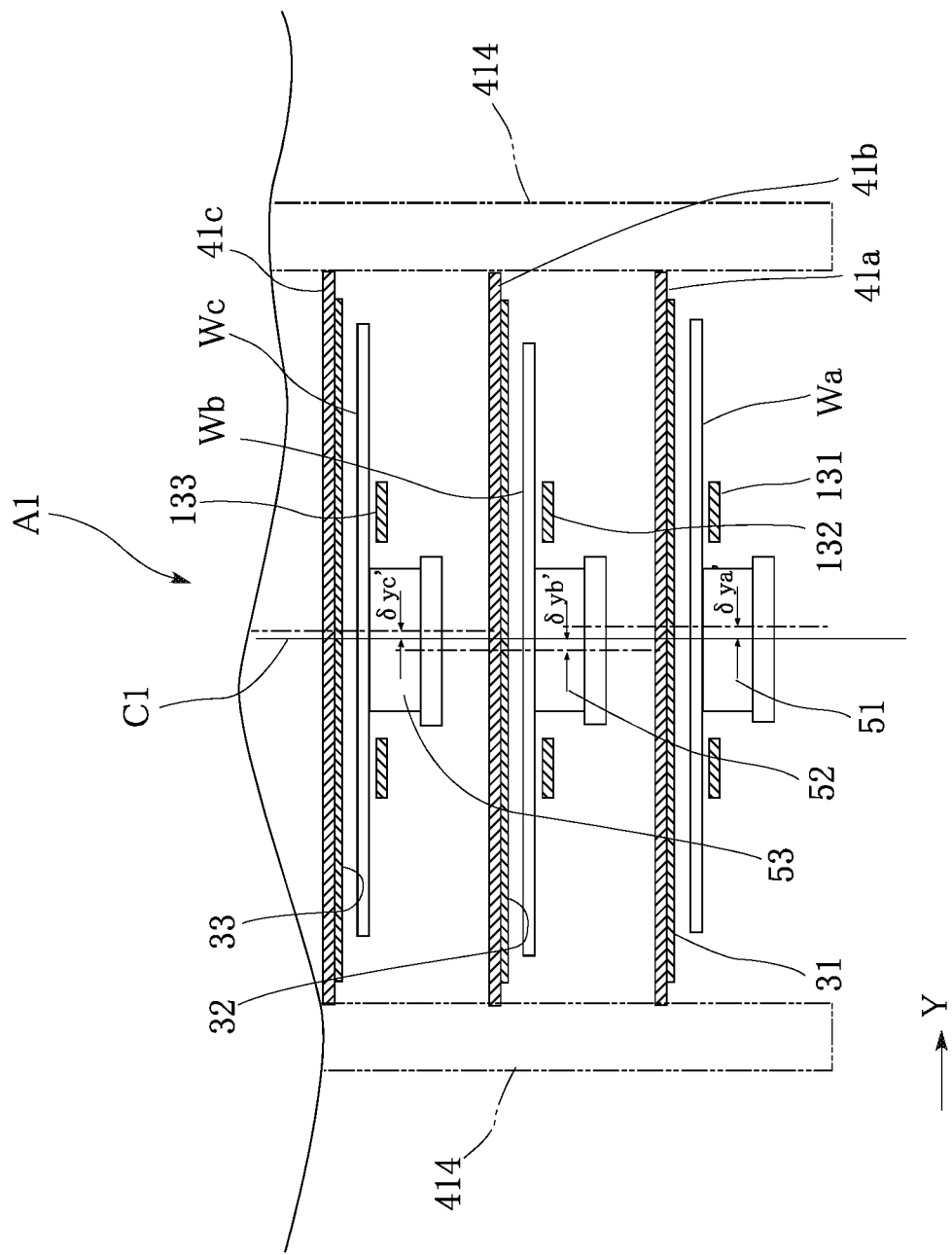
FIG. 15 is a sectional view taken along line 15-15 of FIG. 14.

After the correction by the amounts of θ direction misalignment δθa, δθb, δθc . . . , the positions of the semiconductor wafers Wa, Wb, Wc . . . are adjusted to correct the misalignment in the X-Y direction. Note that the amounts of misalignment in the X-Y direction at this stage (after the correction of θ directions) are not the same as the initial amounts of misalignment δxa, δxb, δxc . . . and δya, δyb, δyc . . . shown in FIG. 10. As shown in FIGS. 13, 14 and 15, as the pins 51, 52, 53 . . . are rotated, the centers O1 of the semiconductor wafers Wa, Wb, Wc . . . rotate about the rotation center C1 by the amounts corresponding to δθa, δθb, δθc . . . before they come to stop. The amounts of positional misalignment in the X-Y direction (secondary positional misalignment) δxa', δxb', δxc' . . . and δya', δyb', δyc' . . . to be corrected are calculated based on the stop positions of O1 and the rotation center C1.

Figure 16:
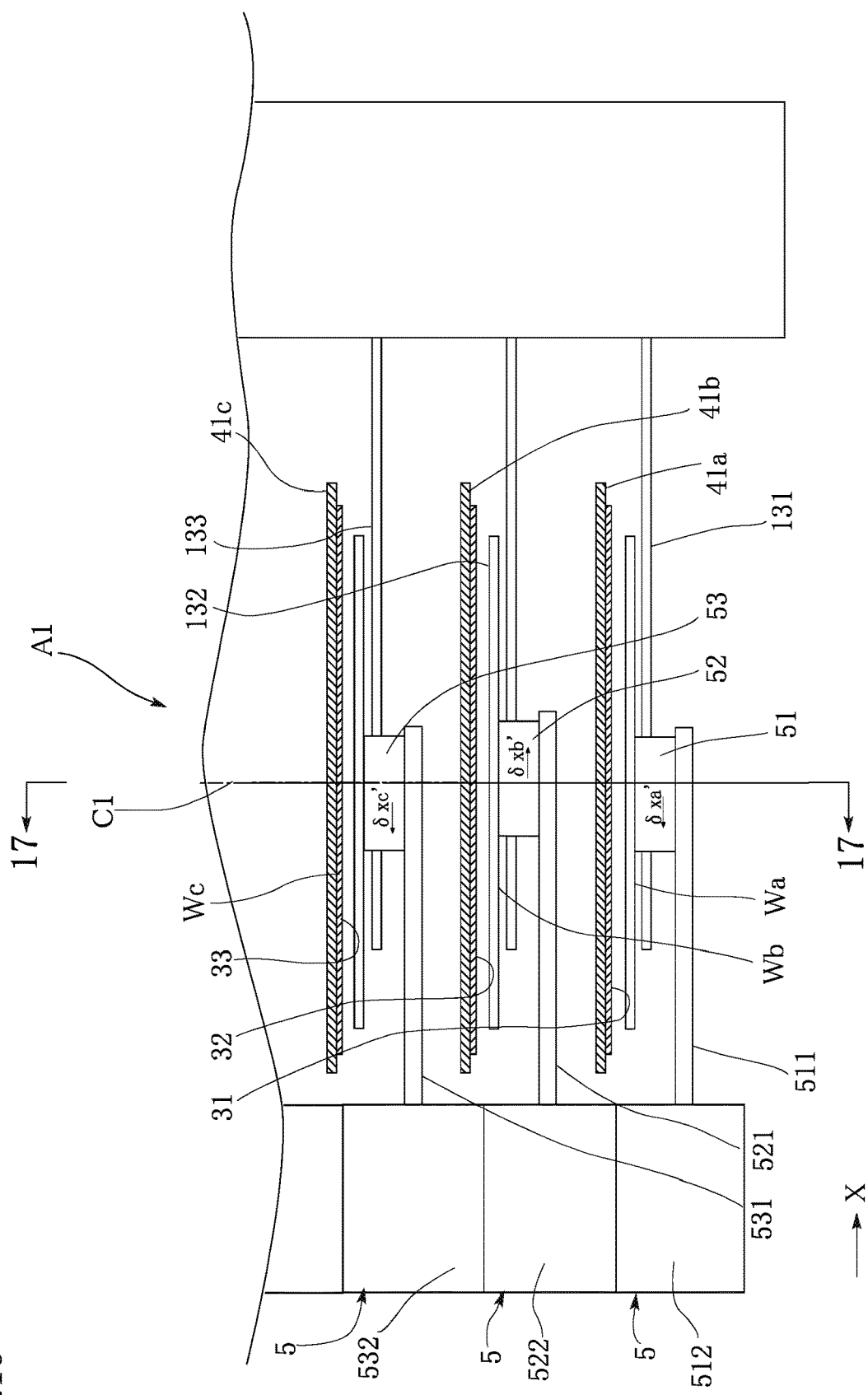
FIG. 16 is a view showing an operation state of the aligner device shown in FIG. 1.
Figure 17:
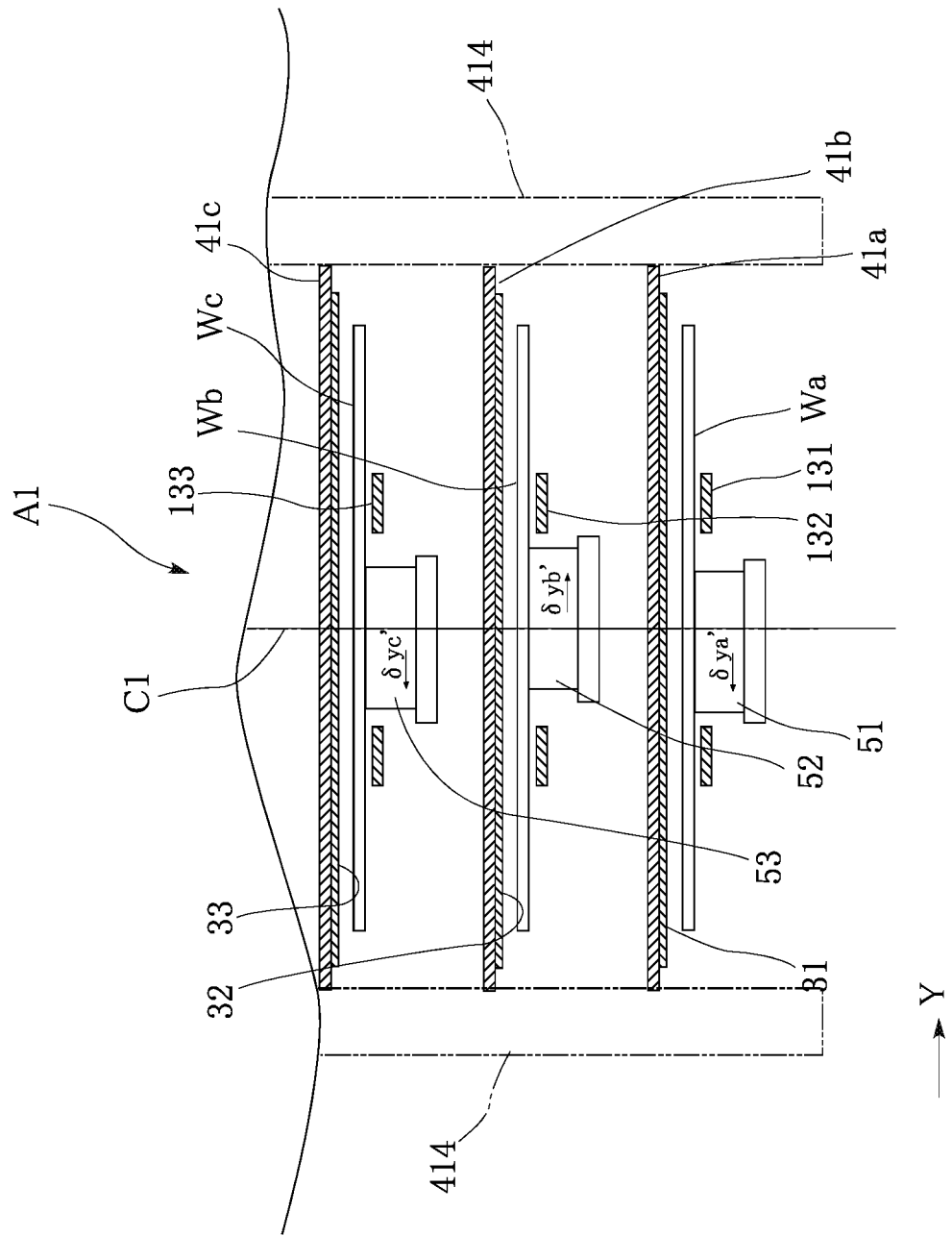
FIG. 17 is a sectional view taken along line 17-17 of FIG. 16.
Figure 18:
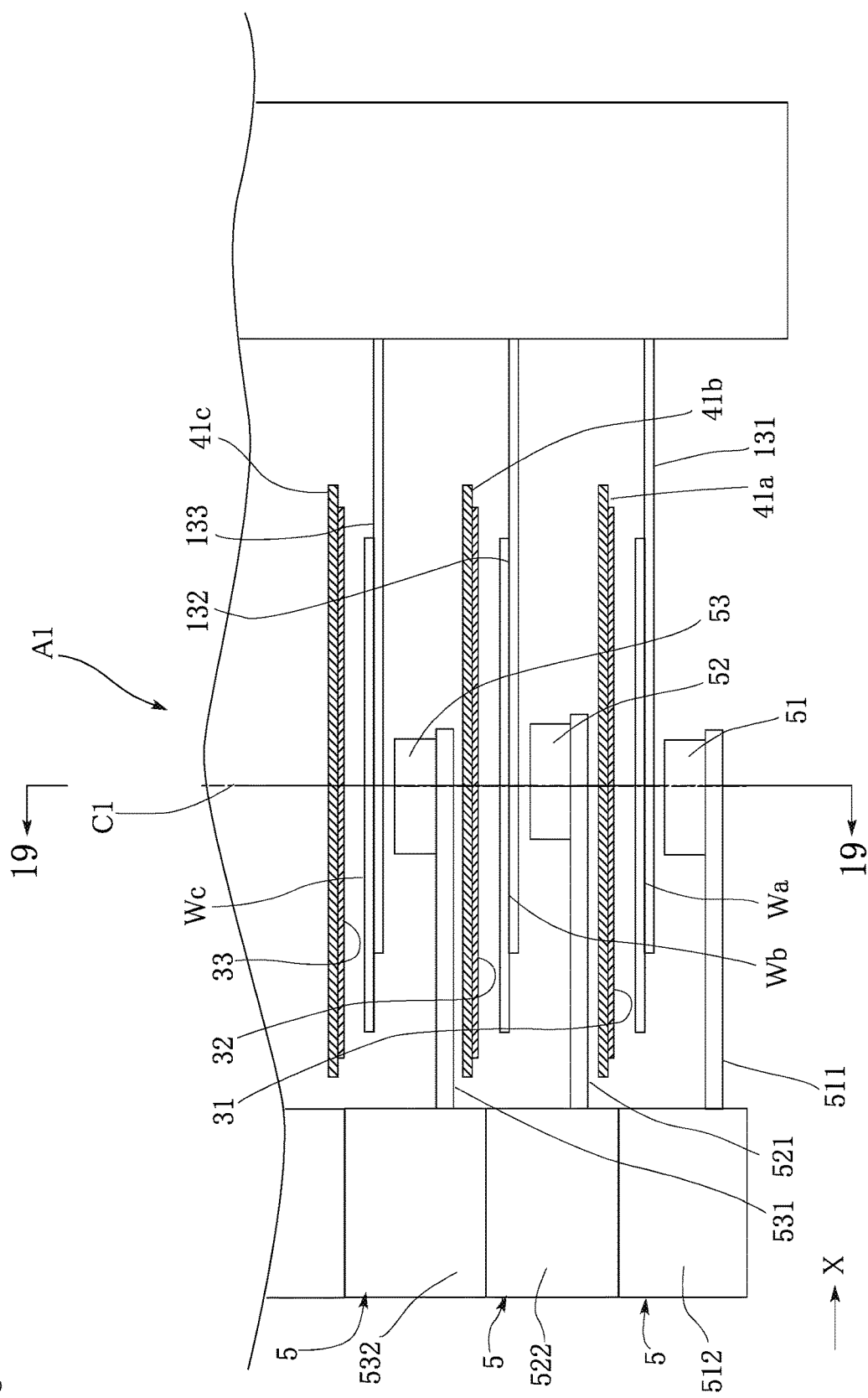
FIG. 18 is a view showing an operation state of the aligner device shown in FIG. 1.
Figure 19:
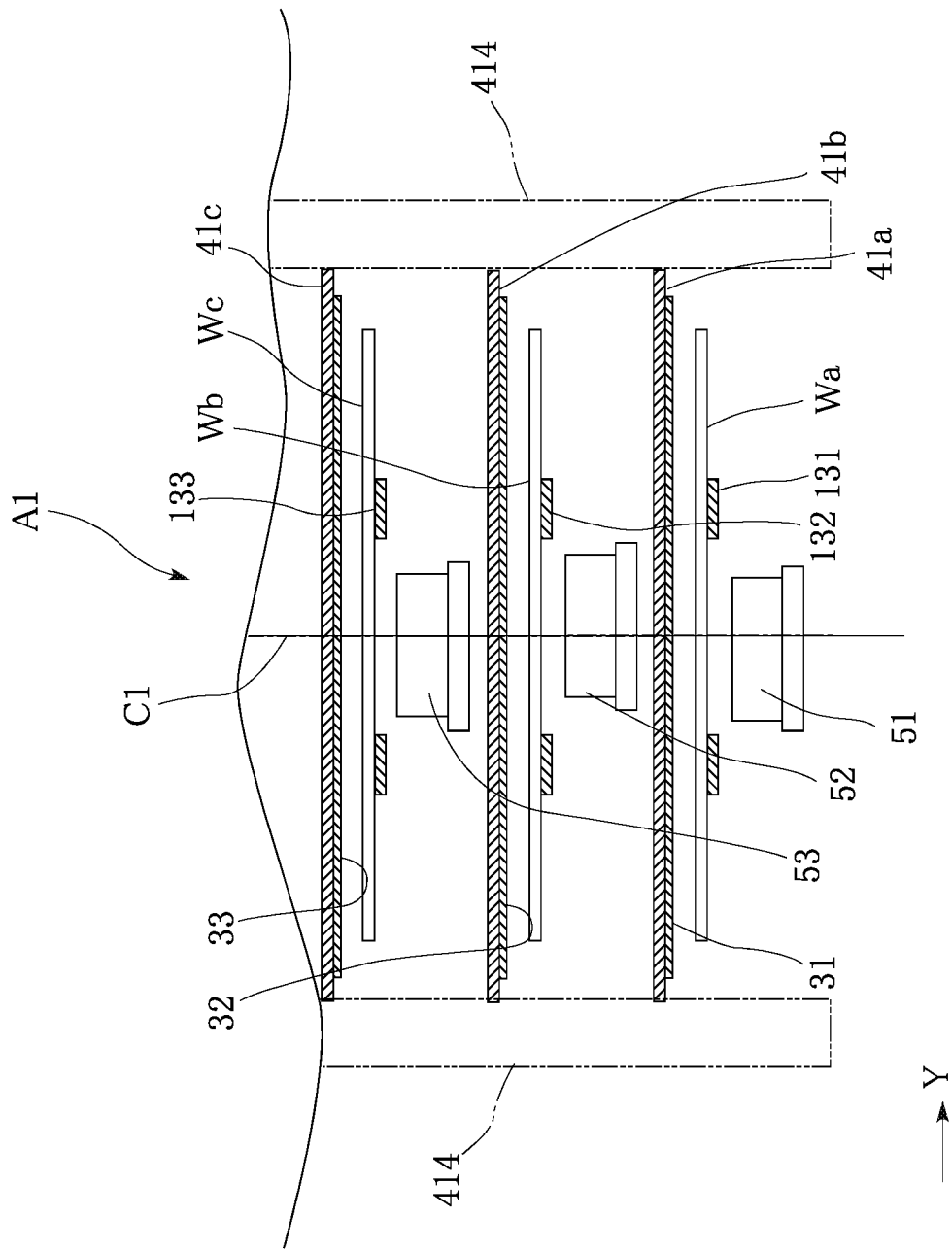
FIG. 19 is a sectional view taken along line 19-19 of FIG. 18.

Subsequently, as shown in FIGS. 16 and 17, the pins 51, 52, 53 . . . still holding the semiconductor wafers Wa, Wb, Wc . . . thereon are moved in the X and Y directions by the amounts corresponding to the secondary positional misalignment δxa', δxb', δxc' . . . and δya', δyb', δyc' of the semiconductor wafers Wa, Wb, Wc . . . . Subsequently, as shown in FIGS. 18 and 19, the pins 51, 52, 53 . . . are lowered until the semiconductor wafers Wa, Wb, Wc . . . are placed onto the corresponding hand members 131, 132, 133 . . . . At this stage, the pins 51, 52, 53 . . . release the suction on the semiconductor wafers Wa, Wb, Wc . . . , and the hand members 131, 132, 133 exert suction on the semiconductor wafers Wa, Wb, Wc . . . . Note that each operation described above can be performed simultaneously on the semiconductor wafers Wa, Wb, Wc . . . . At this stage, the semiconductor wafers Wa, Wb, Wc . . . placed on the hand members 131, 132, 133 . . . are in the correct positions relative to the hand members 131, 132, 133 . . . in all directions (X, Y and θ directions). For example, in the state shown in FIGS. 18 and 19 (viewed in the two mutually perpendicular directions), the semiconductor wafers Wa, Wb, Wc . . . positioned on the hand members 131, 132, 133 . . . are in alignment with the reference position C1.

Subsequently, the robot hand 1 retracts from the frame 4 to transfer the semiconductor wafers Wa, Wb, Wc . . . to the locations for the subsequent processing, while keeping the semiconductor wafers Wa, Wb, Wc . . . on the hand members 131, 132, 133 in alignment with the reference position in the X-Y direction.

As has been described above, the aligner device A1 can capture the outline shapes of the planar workpieces (semiconductor wafers) Wa, Wb, Wc . . . by using the sensors 31, 32, 33 . . . having planner sensor surfaces 311, 321, 331 . . . . The aligner device A1 can also calculate the amounts of positional misalignment of the semiconductor wafers Wa, Wb, Wc . . . with the reference position by using the captured image of the outline shapes. According to the aligner device A1, the units for determining the amounts of positional misalignment of the semiconductor wafers Wa, Wb, Wc . . . can be made thinner in profile.

With the low-profile positional misalignment detecting units, the positional misalignment of a plurality of semiconductor wafers Wa, Wb, Wc . . . can be detected simultaneously and corrected simultaneously. Therefore, the aligner device A1 can reduce the transfer takt time of a plurality of semiconductor wafers Wa, Wb, Wc . . . , including the time for correcting positional misalignment in a semiconductor process.

The present disclosure is not limited to the embodiments described above and intended to cover any modification that can be derived from the scope of each appended claim.

In the embodiments described above, the semiconductor wafers Wa, Wb, Wc . . . are kept out of contact with the sensors 31, 32, 33 . . . to avoid possible contamination of the surfaces of the semiconductor wafers Wa, Wb, Wc . . . . In an embodiment where contamination of the wafer surfaces does not pose problems, the sensors 31, 32, 33 . . . may be brought into contact the semiconductor wafers Wa, Wb, Wc . . . .

The invention claimed is:

1. An aligner device comprising:
a robot hand including a plurality of vertically aligned hand members each of which is configured to hold a planar workpiece placed thereon;
a plurality of arms that are vertically aligned with one another, each arm is associated with a corresponding one of the vertically aligned hand members to receive a planar workpiece therefrom, each arm having a pin connected to a distal end thereof that supports a planar workpiece thereon that is received from the corresponding one of the vertically aligned hand members;
the arms are individually adjustable relative to one another in an X-direction, a Y-direction, and a vertical direction;
each pin is rotatable independently of the other pins about a vertical axis;
a plurality of sensors vertically spaced apart from each other by a predetermined distance, each sensor is associated with a corresponding one of the arms, and each sensor is located above the corresponding arm, each sensor having a sensor surface that faces downward toward the corresponding arm and being configured to capture an outline shape of a planar workpiece that is supported on the pin of the corresponding arm.

2. The aligner device of claim 1, further comprising:
a positional misalignment calculating unit connected to and receiving data from the sensors, the data comprising an image of an outline shape of a planar workpiece that is supported on the pin of the corresponding arm, and the positional misalignment calculating unit determining positional misalignment in X, Y and θ directions of the planar workpiece supported on the pin of the corresponding arm;
an X-Y direction positional misalignment correcting unit connected to and receiving control signals from the positional misalignment calculating unit, and functionally coupled to and controlling the positions of the arms in the X-direction and the Y-direction to adjust the positions of the planar workpieces in the X-direction and in the Y-direction;
a θ direction positional misalignment correcting unit connected to and receiving control signals from the positional misalignment calculating unit, and functionally coupled to and controlling rotation of the pins about the vertical axes to adjust the planar workpieces in the θ directions.

3. The aligner device according to claim 2, further comprising a control unit that controls the X-Y direction positional misalignment correcting unit and the θ direction positional misalignment correcting unit.

4. An aligner device comprising:
a robot hand including a plurality of vertically aligned hand members each of which is configured to hold a planar workpiece placed thereon;
a plurality of pins, each pin is associated with a corresponding one of the vertically aligned hand members to receive a planar workpiece therefrom, and each pin supports a bottom surface of a planar workpiece that is received from the corresponding one of the vertically aligned hand members;
each pin is rotatable independently of the other pins about a vertical axis, and each pin is movable independently of the other pins in an X-direction, a Y-direction, and a vertical direction;
a plurality of sensors vertically spaced apart from each other by a predetermined distance, each sensor is associated with a corresponding one of the pins, and each sensor is located above the corresponding pin, each sensor having a sensor surface that faces downward toward the corresponding pin and being configured to capture an outline shape of a planar workpiece that is supported on the corresponding pin.

* * * * *